(12) United States Patent
Hu et al.

(10) Patent No.: US 6,420,236 B1
(45) Date of Patent: Jul. 16, 2002

(54) HYDROGEN TREATMENT FOR THRESHOLD VOLTAGE SHIFT OF METAL GATE MOSFET DEVICES

(75) Inventors: Jerry C. Hu, Plano; Hong Yang, Dallas; Amitava Chatterjee, Plano; Ih-Chin Chen, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/641,053

(22) Filed: Aug. 17, 2000

Related U.S. Application Data

(60) Provisional application No. 60/150,432, filed on Aug. 24, 1999.

(51) Int. Cl.[7] .................. H01L 21/336; H01L 21/4763
(52) U.S. Cl. .................. 438/291; 438/299; 438/305; 438/627
(58) Field of Search .................. 438/627, 291, 438/643, 194, 299, 286, 305

(56) References Cited

U.S. PATENT DOCUMENTS

| | | | | |
|---|---|---|---|---|
| 5,300,447 A | * | 4/1994 | Anderson | 437/41 |
| 5,489,543 A | * | 2/1996 | Hong | 437/41 |
| 5,677,217 A | * | 10/1997 | Tseng | 437/45 |
| 5,773,348 A | * | 6/1998 | Wu | 438/305 |
| 5,856,225 A | * | 1/1999 | Lee et al. | 438/291 |
| 6,051,281 A | * | 4/2000 | Kobayashi et al. | 427/535 |
| 6,127,232 A | * | 10/2000 | Chatterjee | 438/291 |
| 6,127,268 A | * | 10/2000 | Igel | 438/678 |
| 6,162,724 A | * | 12/2000 | Hsia et al. | 438/669 |
| 6,177,303 B1 | * | 1/2001 | Schmitz et al. | 438/194 |
| 6,180,465 B1 | * | 1/2001 | Gardner et al. | 438/291 |
| 6,200,865 B1 | * | 3/2001 | Gardner et al. | 438/291 |
| 6,197,702 B1 | * | 5/2001 | Tanabe et al. | 438/773 |
| 6,225,170 B1 | * | 5/2001 | Ibok et al. | 438/291 |
| 6,245,618 B1 | * | 6/2001 | An et al. | 438/289 |

* cited by examiner

*Primary Examiner*—John F. Niebling
*Assistant Examiner*—Walter L. Lindsay, Jr.
(74) *Attorney, Agent, or Firm*—Gerald E. Laws; W. James Brady, III; Frederick J. Telecky, Jr.

(57) ABSTRACT

A system for producing metal gate MOSFETs having relatively low threshold voltages is disclosed, comprising the steps of forming 200 a gate oxide layer on a semiconductor substrate, forming 210 a dummy gate on the substrate, removing 260 the dummy gate after further processing and depositing 270 a lower metallic gate material on said gate oxide; treating 280 the semiconductor device with a reducing gas immediately after deposition of the lower metallic gate material, and depositing 290 an upper gate metal over the lower gate material.

23 Claims, 2 Drawing Sheets

HYDROGEN TREATMENT FOR THRESHOLD VOLTAGE SHIFT OF METAL GATE MOSFET DEVICES

This application claims priority under 35 USC § 119(e)(1) of provisional application Nos. 60/150,432 filed Aug. 24, 1999.

TECHNICAL FIELD OF THE INVENTION

The invention relates, in general, to the fabrication of semiconductor devices, and in particular, to the use of a hydrgoen treatment process to shift the threshold voltage of a Metal Oxide Semiconductor Field Effect Transistor ("MOSFET").

BACKGROUND OF THE INVENTION

The continual demand for enhanced integrated circuit performance has driven efforts to optimize semiconductor design and processes on every level. Designers seek the ability to optimize performance characteristics of even the most basic circuit components in order to achieve desired results.

Metal oxide semiconductor field effect transistors (MOSFETs) are used extensively in modern semiconductor devices. Various technologies and techniques may be applied during MOSFET fabrication to effect a desired performance characteristic.

A critical performance parameter of a MOSFET device is its threshold voltage. This threshold voltage, which is essentially the voltage required to turn the transistor "on", and its response characteristics depend greatly on the MOSFET's gate material. A variety of different gate materials have been used in the fabrication of MOSFET devices, including doped polysilicon and metals.

An important characteristic of the gate and/or substrate material known as the workfunction. A material's workfunction, especially that of the gate material, can affect a number of performance parameters in a MOSFET; including the threshold voltage.

In some conventional designs, the gate electrode of a MOSFET comprises a doped polysilicon layer. In conventional MOSFET designs, use of a polysilicon gate typically yields a low difference between the workfunctions of the poly gate and the silicon substrate. The result is a relatively low threshold voltage required to operate the gate. However, certain characteristics of these designs (e.g. poly depletion, resistance) may be undesirable for some designs.

Another conventional approach involves use of metal gates in a MOSFET design. The sheet resistance of a metal gate may be as low as one-tenth that of a poly silicon gate, depending upon the metal and the particular configuration of the device. Additionally, metal gates do not present poly depletion problems. Therefore, commonly used gate metal layers, such as TiN, are advantageous over doped polysilicon gate layers.

A significant disadvantage to the use of TiN and other metal gates used in previous designs has been the difference in workfunction between the metal gate and the silicon substrate. One result is that metal gate MOSFETs have relatively higher threshold voltages, on the order of 0.5 volts, than a comparable polysilicon gate MOSFET.

What is needed, therefore, is a system whereby a metal gate MOSFET can be produced having a lower gate workfunction and, as a result, a lower threshold voltage.

SUMMARY OF THE INVENTION

In the present invention, a metal gate MOSFET device is produced with a threshold voltage adapted to a desired value. During fabrication, hydrogen (H) treatment of metal gates immediately after metal deposition is manipulated to selectively shift the threshold voltage ($V_t$) of a MOSFET to a desired value.

The present invention thus provides a method of producing semiconductor devices, using current semiconductor manufacturing equipment, that more adequately meets the demands of modern high performance integrated circuits.

In one embodiment of the present invention, device processing includes deposition of a metal gate material, such as TiN, and immediately thereafter hydrogen treating the device using a reducing gas. By selectively treating the metal gate material with a H containing reducing gas, the workfunction characteristic of the gate may be lowered and, thus, $V_t$ may be shifted toward a desired value. In one embodiment, the reducing gas is a forming gas. In another embodiment, the reducing gas is silane. In an alternative embodiment, hydrogen treatment is suppressed to effect a desired shift in $V_t$.

One embodiment of the present invention provides a process for production of a metal gate metal oxide semiconductor field effect transistor, including the steps of depositing a first metal gate material over gate oxide, treating the device with a reducing gas immediately after deposition of the metal gate, and then depositing a second metal gate material over the treated first. In a preferred embodiment, the first metal gate material is TiN. In one embodiment, the reducing gas is a forming gas. In another embodiment, the reducing gas is silane. In an alternative embodiment, hydrogen treatment is suppressed to effect a desired shift in $V_t$.

According to the present invention, forming gas treatment is conducted at a temperature of between 400° C. and 500° C., for a period of from about 10 to about 40 minutes. A preferred embodiment conducts forming gas treatment at about 450° C. for a period of approximately 30 minutes. Silane treatment is conducted at a temperature of between 400° C. and 500° C., for a period of from about 10 to about 40 seconds, at a pressure between approximately 1 and 10 mTorr. A preferred embodiment conducts silane treatment at about 450° C. for a period of approximately 30 seconds at a pressure between 1 and 10 mTorr. Depending on the process used and the desired results, reducing gas treatment may be accomplished through a controlled anneal step or, alternatively, an ion implant step.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention defines a system by which a metal gate MOSFET device is produced, having its threshold voltage adapted to a desired value. During fabrication, a processing step, in which the device is treated with a reducing gas immediately after metal deposition, is manipulated to selectively shift the threshold voltage ($V_t$) of a MOSFET to the desired value. By manipulating hydrogen treatment of the metal gate material, the workfunction characteristic of the metal gate may thereby be increased or decreased and, thus, $V_t$ may be shifted toward a desired value.

In a preferred embodiment of the present invention, a device is preferably treated with silane ($SiH_4$), or a forming gas comprising a mixture of 10% hydrogen and 90% nitrogen, immediately after deposition of the metal gate material. Alternatively, depending on the desired device performance, hydrogen treatment may be suppressed to effect a desired alteration of the workfunction characteristic of the metal gate. A number of variations are possible, such as alteration of the forming gas composition. All such possibilities are comprehended by the present invention.

Figure 1:
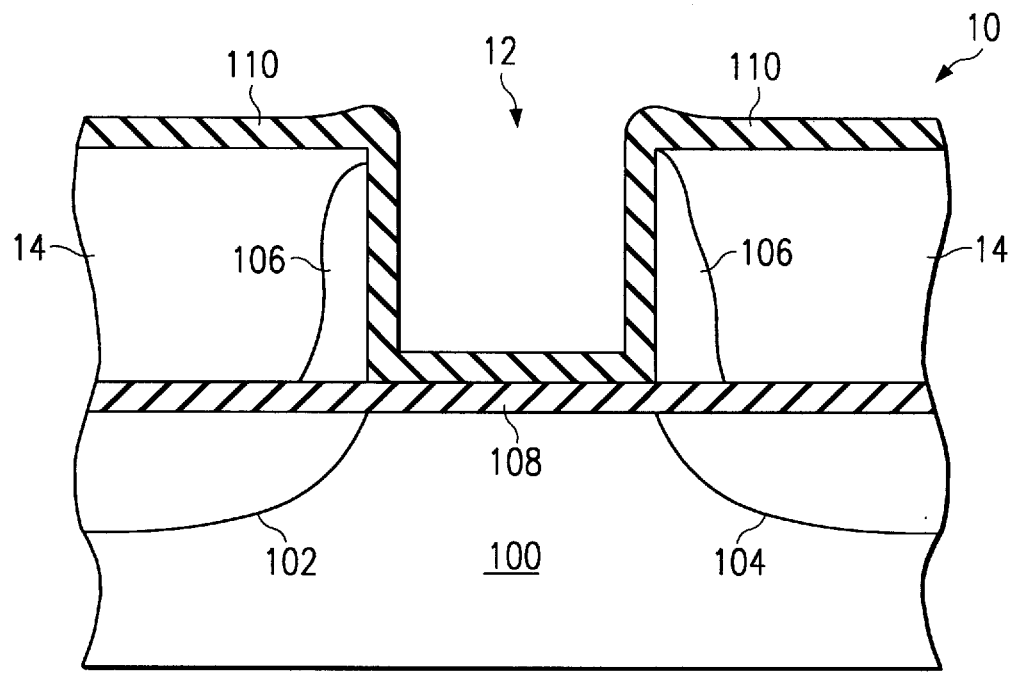
FIG. 1 is a schematic representation illustrative of device production according to the present invention.

FIG. 1 shows a partial schematic illustration of a device 10 produced in accordance with the present invention. Oxide dielectric layer 14 is disposed upon semiconductor substrate 100, and is formed with a gate opening 12 therein. Source 102 and drain 104 regions are formed in the substrate 100 through semiconductor processing, such as an ion implantation process. A thin layer of polysilicon gate oxide 108 is disposed beneath dielectric layer 14 and atop the substrate 100, including source 102 and drain 104. The distance between the source 102 and drain 104 regions defines the channel of device 10. The device may optionally include sidewalls 106, preferably formed from silicon nitride. Sidewalls 106 may be employed to provide an anti-diffusion layer, acting as a barrier during subsequent deposition processes. Multiple sidewalls may be utilized, depending upon the particular application.

A lower gate layer 110 of a metallic material, such as titanium nitride (TiN), is disposed atop dielectric layer 14, sidewalls 106, and gate oxide 108. Gate layer 110 is deposited by standard semiconductor processing, typically Chemical Vapor Deposition (CVD). A layer 110 of TiN is typically in the range of 100 Å to 500 Å thick, depending upon the particular application, desired performance, processing conditions and techniques. In a preferred embodiment, a layer of titanium nitride will be approximately 200 Å thick.

After deposition of metal layer 110, before any additional processing steps, device 10 is treated with a reducing gas. In one embodiment of the present invention, the device is treated with a forming gas for a period of from about 10 minutes to about 40 minutes, at a temperature of from about 400° C. and 500° C., at atmospheric pressure. In a preferred embodiment, device 10 is treated with forming gas for a period of approximately 30 minutes at a temperature of about 450° C. at atmospheric pressure.

In an alternative embodiment, device 10 is treated with silane for a period of from about 10 seconds to about 40 seconds, at a temperature of from about 400° C. to 500° C., at a pressure between about 1 and 10 mTorr. In a preferred embodiment, device 10 is treated with silane for a period of approximately 30 seconds at a temperature of about 450° C. at pressure between about 1 and 10 mTorr.

Employing such treatment results in a shifting of the gate threshold voltage $V_t$. It appears that atomic hydrogen, released from the reducing gas, which is either forming gas or silane, penetrates the relatively thin metal layer (TiN) to the interface between the metal and the gate oxide layers. At that interface the hydrogen enhances mobility of electrons when a voltage is applied to the gate, thus reducing the voltage required to turn the device "on".

Figure 2:
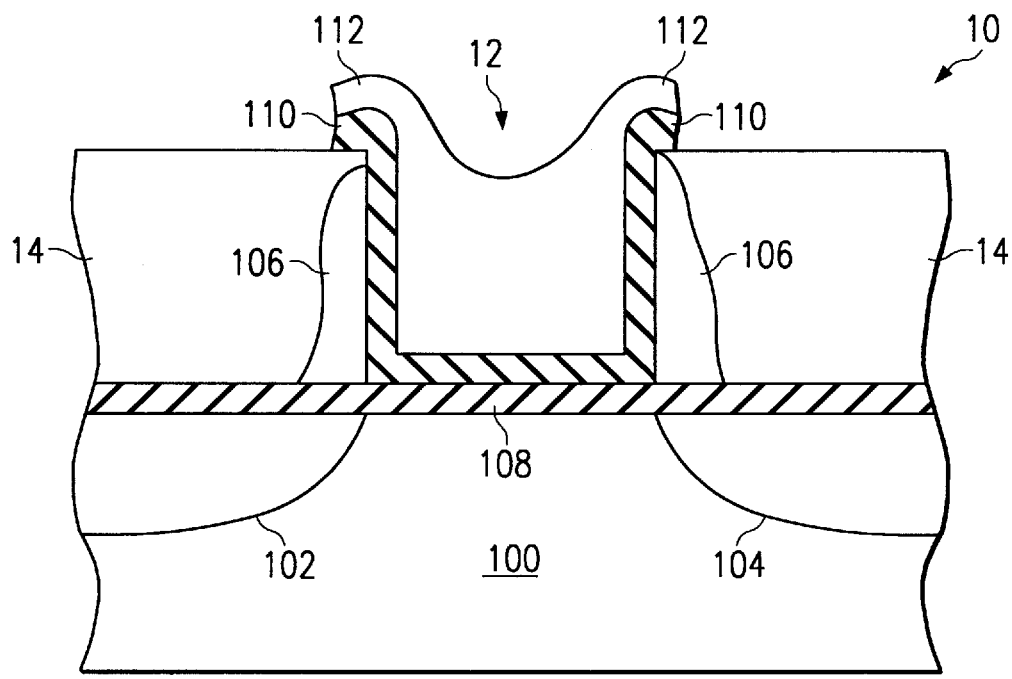
FIG. 2 is a schematic representation illustrative of a device produced according to the present invention.

Referring now to FIG. 2, device 10 of FIG. 1 is shown, after treatment with a reducing gas in accordance with the present invention. An upper gate metal layer 112, such as tungsten or aluminum, is disposed atop metal layer 110, completing gate formation. In one embodiment, metal layer 112 comprises a layer of tungsten; between about 800 Å and 1200 Å thick, and deposited using semiconductor processing techniques.

Figure 3:
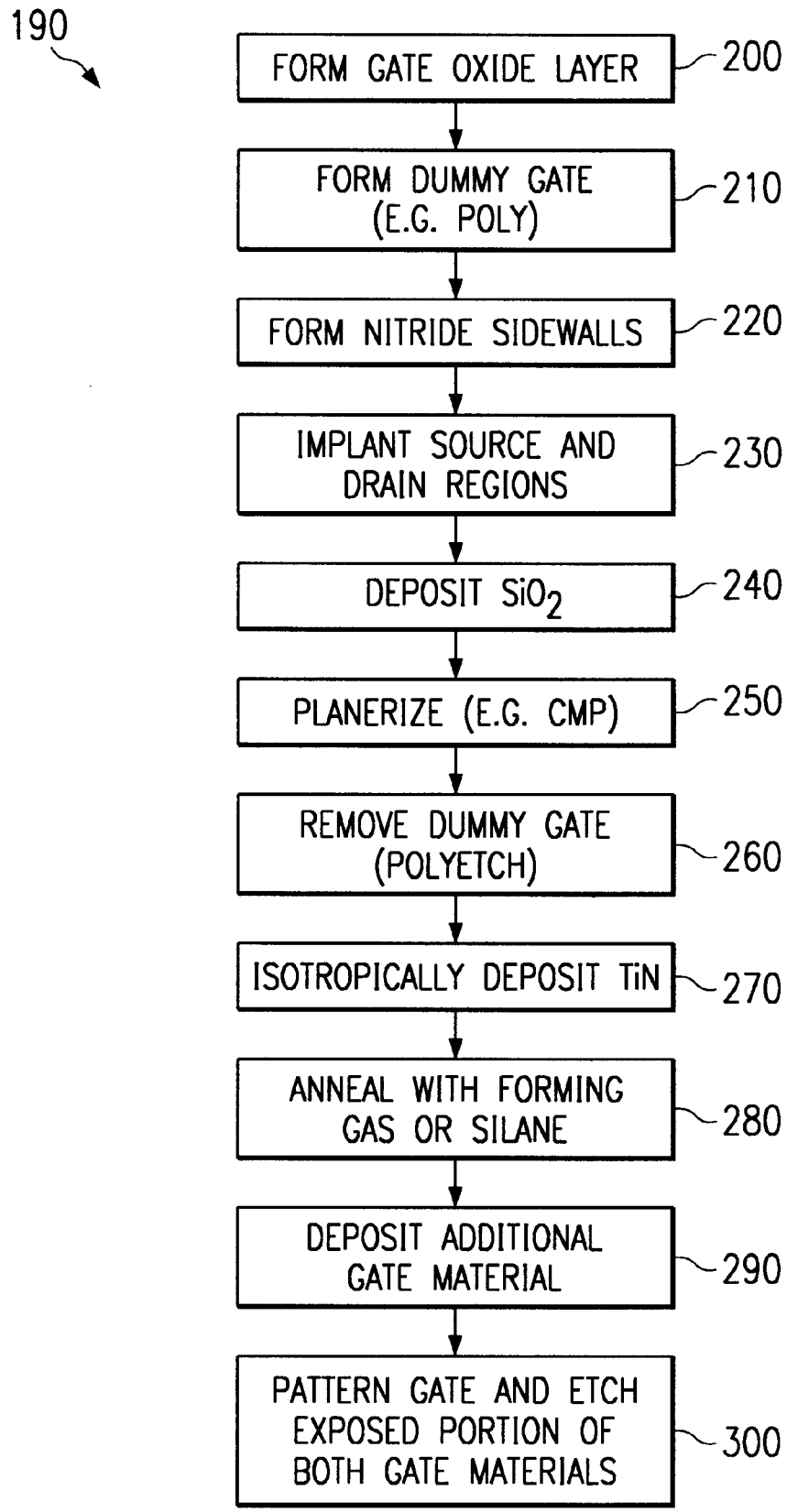
FIG. 3 is a diagram illustrating one embodiment of the present invention's system.

FIG. 3 illustrates an exemplary fabrication process 190 for device 10 according to the present invention. Standard semiconductor processing technologies and methodologies may be employed in conjunction with the present disclosure to achieve the desired result. Process 190 includes formation 200 of a gate oxide layer. A dummy gate is formed 210, as are the nitride sidewalls 220. Source and drains regions are implanted 230 into the substrate. Here a dummy gate from a material selectively etchable relative to the $SiO_2$ and $SI_3N4$ (e.g., polys,ilicon) is utilized. The $SiO_2$ is deposited 240, the material is planarized 250, and the dummy gate is removed 260 (e.g. by polyetch). A lower metal layer is placed; in this case TiN is isotropically deposited 270. The device is then annealed 280 with a reducing gas. Deposition 290 of additional gate material follows the reducing gas treatment. Finally, patterning and etching 300 of the gate materials concludes process 190.

It should be apparent to those of skill in the art that this process is merely exemplary, and that combination, deletion, or addition of steps is within the contemplation of the present invention. For example, if sidewalls are not desired in device 10, step 220 may be passed. Depending on the semiconductor process used, and on the desired results, the reducing gas treatment 280 may be accomplished through a controlled anneal step or, alternatively, an ion implant step.

An exemplary embodiment as herein described illustrates the principles of the present invention. Block capacitor structures having an area of 5.94e−4 cm$^2$ and having and having a 67 Å gate oxide layer, a 200 Å TiN first metal layer, and a 800 Å tungsten second metal layer, are formed with and without the disclosed reducing gas treatment. A flatband voltage, $V_{FB}$, of the structure is the difference between the workfunction of the gate and that of the substrate, ignoring charge in the oxide, and ,is determined from capacitance-voltage (C-V) characterization. A total gate current density, $J_g$, and a hole current density $J_p$, are obtained from destructive current-voltage (I-V) characterization. As a result, the device formed with reducing gas treatment has the following characteristics: $V_{FB}$=−0.8 V; +$V_g$ ($J_g$=1 m)=6.9 V; and $J_p/J_g$(1 m)=6e−4. A device formed without reducing gas treatment has the following characteristics: $V_{FB}$=−0.98 V; +$V_g(J_g$=1 m)=6.4 V; and $J_p/J_g$(1 m)=1.5e−4. Hence, the lower $V_{FB}$, lower $V_g$ (where $V_g$ is the gate voltage corresponding to a constant gate current density of 1 mA/cm$^2$), and the $J_p/J_g$(1 m) values are all indicative of the TiN gate threshold voltage being lower with reducing gas treatment. Thus, by selectively treating a metal gate material of a metal gate MOSFET with a hydrogen containing reducing gas, threshold gate voltage $V_t$ may be shifted toward a desired value.

While this invention has been described in reference to illustrative embodiments, this description is not intended to be construed in a limiting sense. For example, it is anticipated that other materials, especially conductive nitrides, can be used as alternatives to TiN. Other various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of altering a threshold voltage in a semiconductor device comprising the steps of:
   providing a substrate material;
   processing said substrate material with an oxide material;
   depositing a first metallic material over said oxide material; and
   treating the semiconductor device with a reducing gas immediately after deposition of the first metallic material, wherein the step of treating the semiconductor device with a reducing gas comprises treating the semiconductor device with a forming gas or with silane at a temperature between about 400° C. and about 500° C.

2. The method of claim 1 wherein the step of depositing a first metallic material over said oxide material comprises depositing TiN.

3. The method of claim 1 wherein the step of treating the semiconductor device with a reducing gas comprises treating the semiconductor device with a forming gas for a period of about 10 minutes to about 40 minutes.

4. The method of claim 1 wherein the step of treating the semiconductor device with a reducing gas comprises treating the semiconductor device with a forming gas at atmospheric pressure.

5. The method of claim 1 wherein the step of treating the semiconductor device with a reducing gas comprises treating the semiconductor device with silane at temperature between about 400° C. and 500° C. and pressure between about 1 mTorr and 10 mTorr.

6. The method of claim 4 wherein the step of treating the semiconductor device with a reducing gas comprises treating the semiconductor device with silane for a period of about 10 seconds to 40 seconds.

7. The method of claim 1 further comprising the step of depositing a second metallic material over the first metallic material after the step of treating the semiconductor device with a reducing gas.

8. A method of producing a metal gate MOSFET device comprising the steps of:
   providing a substrate material;
   processing said substrate material with a gate oxide material;
   depositing a first metallic gate material over said gate oxide material;
   treating the MOSFET device with a reducing gas immediately after deposition of the metallic material, wherein the step of treating the semiconductor device with a reducing gas comprises treating the semiconductor device with a forming gas or with silane at a temperature between about 400° C. and about 500° C.; and
   depositing a second metallic gate material over the first metallic gate material.

9. The method of claim 8 wherein the step of depositing a first metallic gate material over said oxide material comprises depositing TiN.

10. The method of claim 8 wherein the step of treating the semiconductor device with a reducing gas comprises treating the semiconductor device with a forming gas comprising a mixture of approximately 10% hydrogen and 90% nitrogen.

11. The method of claim 8 wherein the step of treating the semiconductor device with a reducing gas comprises treating the semiconductor device with a forming gas for a period of about 10 minutes to about 40 minutes.

12. The method of claim 8 wherein the step of treating the semiconductor device with a reducing gas comprises treating the semiconductor device with a forming gas at atmospheric pressure.

13. The method of claim 8 wherein the step of treating the semiconductor device with a reducing gas comprises treating the semiconductor device with silane at temperature between about 400° C. and 500° C. and pressure between about 1 mTorr and 10 mTorr.

14. The method of claim 8 wherein the step of treating the semiconductor device with a reducing gas comprises treating the semiconductor device with silane for a period of about 10 seconds to 40 seconds.

15. The method of claim 8 wherein the step of depositing a second metallic gate material comprises depositing a tungsten layer.

16. A method of altering a threshold voltage in a MOSFET device comprising the steps of:
    providing a substrate material;
    processing said substrate material with a gate oxide material;
    depositing a first metallic gate material over said gate oxide material; and
    treating the MOSFET device with a hydrogen containing reducing gas immediately after deposition of the first metallic gate material such that hydrogen atoms penetrate into an interface between the gate oxide material and the first metallic gate material, wherein the step of treating the MOSFET device with a reducing gas comprises treating the MOSFET device with a forming gas or with silane at a temperature between about 400° C. and about 500° C.

17. The method of claim 16 further comprising the step of depositing a second metallic gate material over the first metallic gate material.

18. The method of claim 16 wherein the step of depositing a first metallic gate material over said oxide material comprises depositing TiN.

19. The method of claim 16 wherein the step of treating the MOSFET device with a reducing gas comprises treating the MOSFET device with a forming gas comprising a mixture of approximately 10% hydrogen and 90% nitrogen.

20. The method of claim 16 wherein the step of treating the MOSFET device With a reducing gas comprises treating the MOSFET device with a forming gas for a period of about 10 minutes to about 40 minutes.

21. The method of claim 16 wherein the step of treating the MOSFET device with a reducing gas comprises treating the MOSFET device with a forming gas at atmospheric pressure.

22. The method of claim 16 wherein the step of treating the MOSFET device with a reducing gas comprises treating the MOSFET device with silane at temperature between about 400° C. and 500° C. and pressure between about 1 mTorr and 10 mTorr.

23. The method of claim 16 wherein the step of treating the MOSFET device with a reducing gas comprises treating the MOSFET device with silane for a period of about 10 seconds to 40 seconds.

* * * * *